(12) United States Patent
Ueno et al.

(10) Patent No.: US 9,172,335 B2
(45) Date of Patent: Oct. 27, 2015

(54) OPTICAL RECEIVER MODULE

(71) Applicant: Mitsubishi Electric Corporation, Tokyo (JP)

(72) Inventors: Yuto Ueno, Tokyo (JP); Tatsuo Hatta, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 103 days.

(21) Appl. No.: 14/221,338

(22) Filed: Mar. 21, 2014

(65) Prior Publication Data
US 2014/0367557 A1    Dec. 18, 2014

(30) Foreign Application Priority Data

Jun. 13, 2013    (JP) ................ 2013-124729

(51) Int. Cl.
| | |
|---|---|
| *H01J 40/14* | (2006.01) |
| *H01L 27/00* | (2006.01) |
| *H03F 3/08* | (2006.01) |
| *H04B 10/60* | (2013.01) |

(52) U.S. Cl.
CPC . *H03F 3/08* (2013.01); *H04B 10/60* (2013.01)

(58) Field of Classification Search
CPC .................. H04B 10/60; H03F 3/08

USPC ............ 250/214.1, 214 A, 214 LA; 257/290, 257/431, 448

See application file for complete search history.

(56) References Cited

U.S. PATENT DOCUMENTS

| | | | |
|---|---|---|---|
| 6,684,032 B1 * | 1/2004 | Umeda ............... | H04B 10/695 257/80 |
| 2012/0070121 A1 | 3/2012 | Ito et al. | |
| 2015/0069220 A1 * | 3/2015 | Yagisawa ............. | H03F 3/08 250/214 A |

FOREIGN PATENT DOCUMENTS

| | | |
|---|---|---|
| JP | 2012-69681 A | 4/2012 |
| JP | 2012-169478 A | 9/2012 |

* cited by examiner

*Primary Examiner* — Kevin Pyo
(74) *Attorney, Agent, or Firm* — Leydig, Voit & Mayer, Ltd.

(57) ABSTRACT

An optical detector module includes a carrier, a photodetector secured to a top surface of the carrier and having a light detecting portion, an anode terminal, and a cathode terminal, an amplifier circuit secured to the top surface of the carrier and having a first edge, an input terminal, and a GND terminal. The input terminal and the GND terminal are located along the first edge. A first wire connects the anode terminal to the input terminal, and to a composite component secured to the top surface of the carrier and having a metal portion and a resistive portion integrated together. The metal portion is in contact with the carrier. A capacitor, having a top surface electrode and a bottom surface electrode is secured to the carrier.

8 Claims, 11 Drawing Sheets

Comparative example

Comparative example

Comparative example

OPTICAL RECEIVER MODULE

BACKGROUND OF THE INVENTION

1. Field of the Invention

The present invention relates to an optical receiver module for use, e.g., in optical fiber communications, etc.

2. Background Art

Japanese Laid-Open Patent Publication No. 2012-169478 discloses an optical receiver module including a photodetector. This optical receiver module has a resistor and a capacitor which are connected in series between the cathode terminal of the photodetector and the device carrier. The anode terminal of the photodetector is wire-connected to an amplifier circuit. The GND terminal of the amplifier circuit is wire-connected to the device carrier.

The above resistor serves to attenuate resonance resulting from the reflection at the input terminal of the amplifier circuit. The above capacitor serves to reduce variations in the bias voltage.

In order to stabilize the GND potential of the amplifier circuit of such an optical receiver module, it is important to reduce the length of the wire electrically connected between the GND terminal of the amplifier circuit and the carrier. However, the above disclosed optical receiver module is configured in such a manner that the wire connected between the GND terminal of the amplifier circuit and the carrier is long, resulting in an inability to stabilize the GND potential of the amplifier circuit.

Further, one known method for stabilizing the high frequency characteristics of an optical receiver module is to connect a resistance and a capacitor in series between the cathode terminal of the photodetector and the carrier. This means, however, that an electrical path (or circuit) is formed which extends from the input terminal of the amplifier circuit, through the photodetector, the resistance, the capacitor, and the carrier (GND), back to the input terminal of the amplifier circuit. The bandwidth of the optical receiver module is limited by the length of this electrical path. Therefore, in order to increase the bandwidth of the optical receiver module, it is important to reduce the length of this electrical path.

However, the components mounted on the carrier have a predetermined minimum size (e.g., 0.25 mm square), and furthermore a certain space must be provided between adjacent components to accommodate the positional tolerance of the components. These requirements result in an increase in the length of the above electrical path.

SUMMARY OF THE INVENTION

The present invention has been made to solve the above problems. It is, therefore, an object of the present invention to provide an optical receiver module having an increased bandwidth and in which the amplifier circuit has a stable GND potential.

The features and advantages of the present invention may be summarized as follows.

According to one aspect of the present invention, an optical receiver module includes a carrier, a photodetector secured to a top surface of the carrier and having a light receiving portion, an anode terminal, and a cathode terminal, the photodetector serving to convert an optical signal into an electrical signal, an amplifier circuit secured to the top surface of the carrier and having a first edge, an input terminal, and a GND terminal, the input terminal and the GND terminal being formed along the first edge, a first wire connecting the anode terminal to the input terminal, a composite component secured to the top surface of the carrier and having a metal portion and a resistive portion integrated together, the metal portion being in contact with the carrier, a second wire connecting the cathode terminal to one end of the resistive portion, a third wire connecting the GND terminal to a top surface of the metal portion, a capacitor having a top surface electrode and a bottom surface electrode which is secured to the carrier, and a fourth wire connecting the top surface electrode to the other end of the resistive portion.

Other and further objects, features and advantages of the invention will appear more fully from the following description.

DETAILED DESCRIPTION OF THE PREFERRED EMBODIMENTS

Optical receiver modules in accordance with embodiments of the present invention will be described with reference to the accompanying drawings. Throughout the specification the same or corresponding components are designated by the same reference symbols and may be described only once.

First Embodiment

Figure 1:
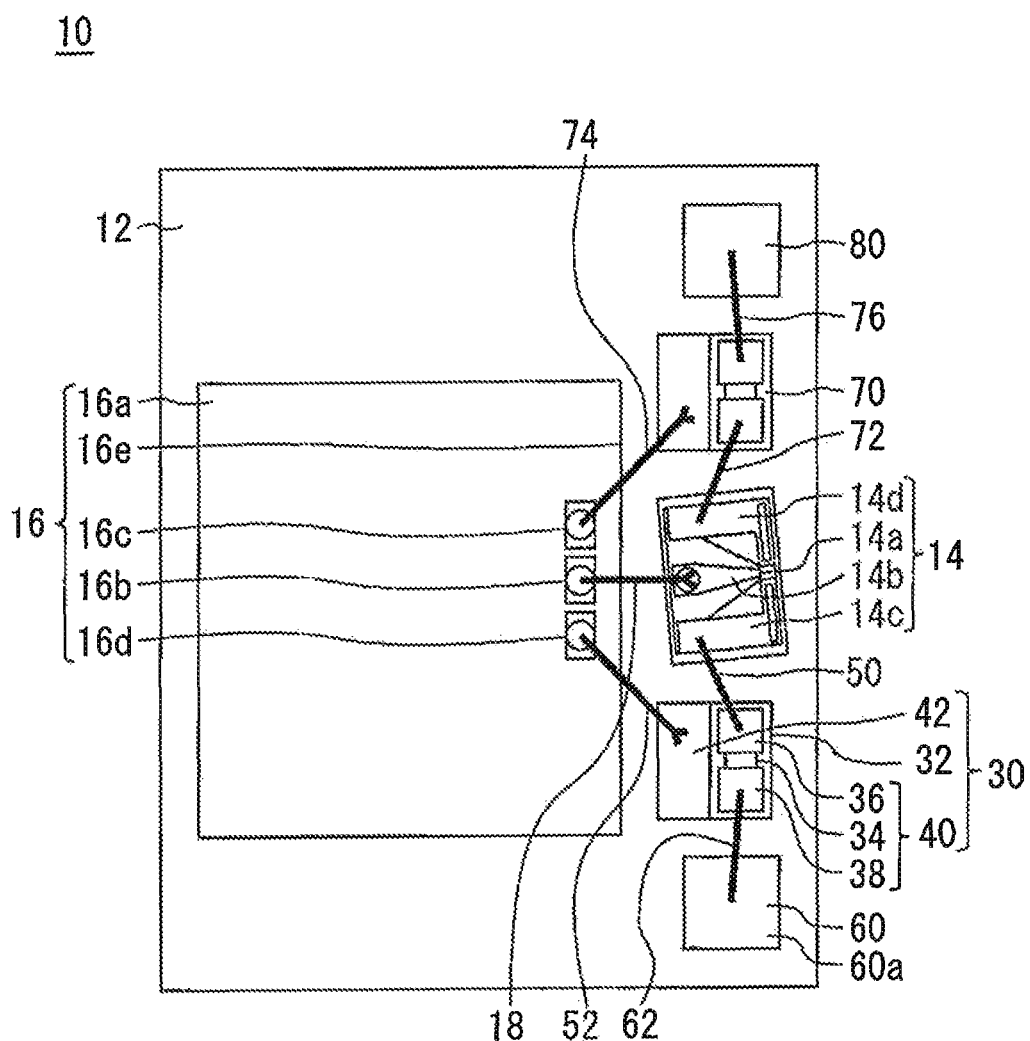
FIG. 1 is a plan view of an optical receiver module in accordance with a first embodiment.

FIG. 1 is a plan view of an optical receiver module 10 in accordance with a first embodiment of the present invention. The optical receiver module 10 has a carrier 12 formed of a conductive material. The carrier 12 is a base on which components are mounted. The carrier 12 may be formed of any conductive material, e.g., an alloy of iron, nickel, and cobalt. A photodetector 14 is secured to the top surface of the carrier 12. The photodetector 14 includes a light receiving portion 14a, an anode terminal 14b, and cathode terminals 14c and 14d. The photodetector 14 may be any device for converting optical signals into electrical signals. Examples of such devices include photodiodes.

A trans-impedance amplifier (TIA) 16 serving as an amplifier circuit is also secured to the top surface of the carrier 12. The TIA 16 has a body portion 16a formed of an SiGe-based material. An input terminal 16b and GND terminals 16c and 16d are formed on the top surface of the body portion 16a. Specifically, the input terminal 16b and the GND terminals 16c and 16d are formed along a first edge 16e of the TIA 16. The anode terminal 14b of the photodetector 14 is connected to the input terminal 16b by a first wire 18. The TIA 16 receives a current signal from the photodetector 14 through the first wire 18 and converts it into a voltage signal.

A composite component 30 is also secured to the top surface of the carrier 12. The composite component 30 includes a substrate 32. The substrate 32 may be formed of any dielectric material, e.g., aluminum oxide. A resistive element 34 is formed on the top surface of the substrate 32. Further, a first bonding pad 36 and a second bonding pad 38 are also formed on the top surface of the substrate 32.

The first bonding pad 36 is directly connected to one end of the resistive element 34, and the second bonding pad 38 is directly connected to the other end of the resistive element 34. The resistive element 34, the first bonding pad 36, and the second bonding pad 38 may be hereinafter referred to collectively as the resistive portion 40. The resistive portion 40 serves to suppress resonance.

Figure 2:
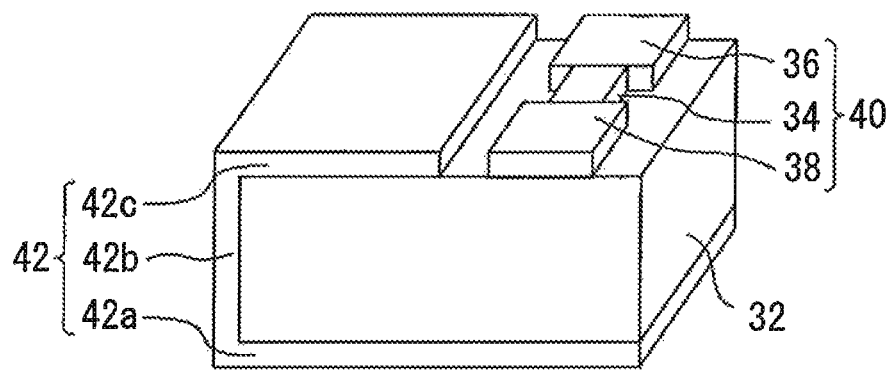
FIG. 2 is a perspective view of the composite component.

The composite component 30 has a metal portion 42 in contact with the carrier 12. The metal portion 42 is formed on the substrate 32 and is not in contact with the resistive portion 40. The metal portion 42 will be described with reference to FIG. 2. FIG. 2 is a perspective view of the composite component 30. A metalized bottom surface portion 42a is formed on the bottom surface of the substrate 32 and is in contact with the carrier 12. A metalized side surface portion 42b is formed integrally with the metalized bottom surface portion 42a and located on a side surface of the substrate 32. A metalized top surface portion 42c is formed integrally with the metalized side surface portion 42b and located on a portion of the top surface of the substrate 32.

Thus, the metal portion 42 has the metalized bottom surface portion 42a, the metalized side surface portion 42b, and the metalized top surface portion 42c. The entire metal portion 42 is at GND potential, since the metalized bottom surface portion 42a is in contact with the carrier 12.

As shown in FIG. 2, in the composite component 30, both the metal portion 42 and the resistive portion 40 are formed on the substrate 32. It should be noted that the first bonding pad 36, the second bonding pad 38, and the metal portion 42 may be formed of any metal, e.g., gold.

Referring back to FIG. 1, the cathode terminal 14c of the photodetector 14 is connected to the first bonding pad 36 of the resistive portion 40 by a second wire 50. The GND terminal 16d of the TIA 16 is connected to the top surface (the metalized top surface portion 42c) of the metal portion 42 by a third wire 52.

Figure 3:
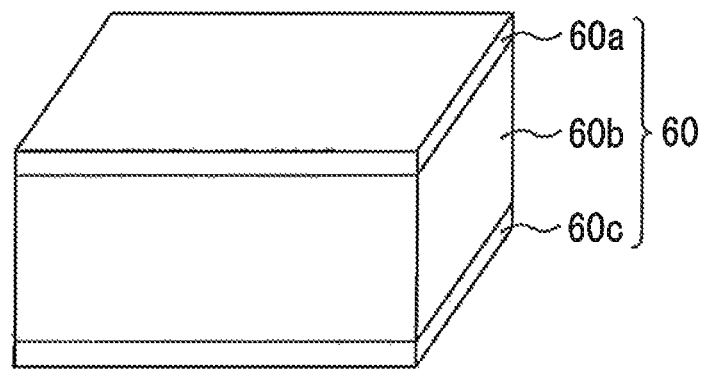
FIG. 3 is a perspective view of the capacitor.

A capacitor 60 is also secured to the top surface of the carrier 12. FIG. 3 is a perspective view of the capacitor. The capacitor 60 includes a dielectric 60b, a top surface electrode 60a formed on the top surface of the dielectric 60b, and a bottom surface electrode 60c formed on the bottom surface of the dielectric 60b. The bottom surface electrode 60c is secured to the carrier 12. The capacitor 60 serves to stabilize the voltage applied to the photodetector 14. Referring back to FIG. 1, the top surface electrode 60a of the capacitor 60 is connected to the second bonding pad 38 of the resistive portion 40 by a fourth wire 62.

A composite component 70 and a capacitor 80 are provided on the top surface of the carrier 12 on the opposite side of the photodetector 14 from the composite component 30 and the capacitor 60. The composite component 70 has the same configuration as the composite component 30. The capacitor 80 has the same configuration as the capacitor 60. The length of the electrical path from the cathode terminal 14c of the photodetector 14, through the resistive portion 40 of the composite component 30 and the capacitor 60, to the carrier 12 is substantially equal to the length of the electrical path from the cathode terminal 14d, through the resistive portion of the composite component 70 and the capacitor 80, to the carrier 12.

The second wires 72 and 50 have the same length, the third wires 74 and 52 have the same length, and the fourth wires 76 and 62 have the same length. As shown in FIG. 1, the photodetector 14, the composite components 30 and 70, and the capacitors 60 and 80 are arranged in a line along the first edge 16e of the TIA 16, as viewed in plan.

Figure 4:
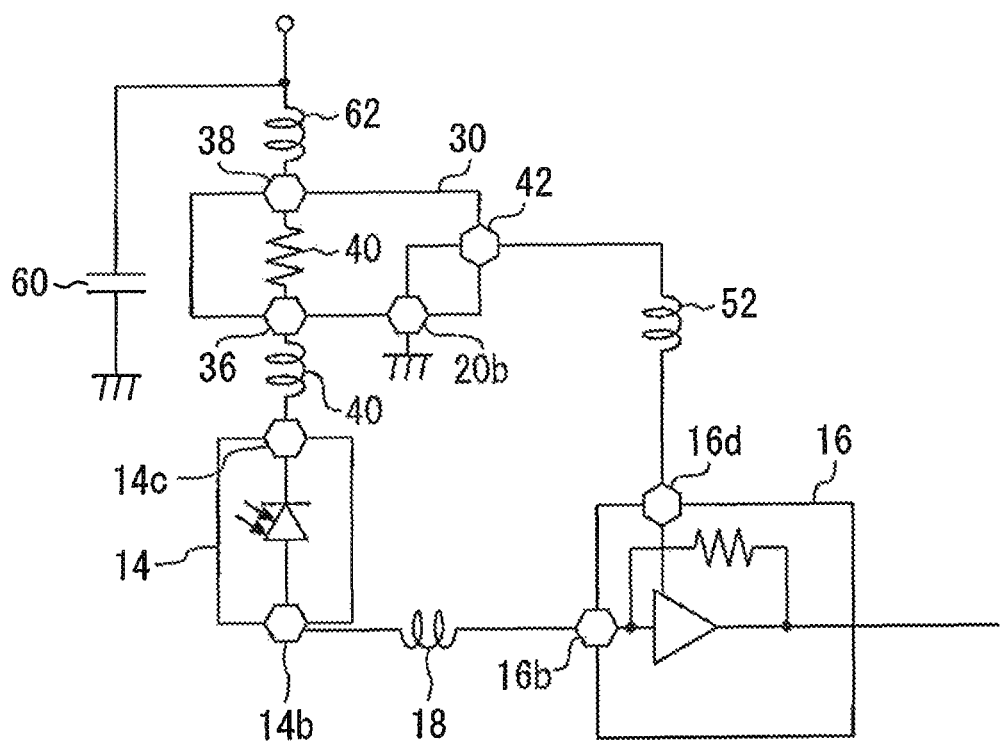
FIG. 4 is a circuit diagram of the optical receiver module of the first embodiment.

FIG. 4 is a circuit diagram of the optical receiver module of the first embodiment. This circuit diagram shows a circuit portion including the photodetector 14, the TIA 16, the composite component 30, the capacitor 60, and the wires interconnecting these components. It should be noted that the first wire 18, the second wire 50, the third wire 52, and the fourth wire 62 are represented by inductors in FIG. 4.

Figure 5:
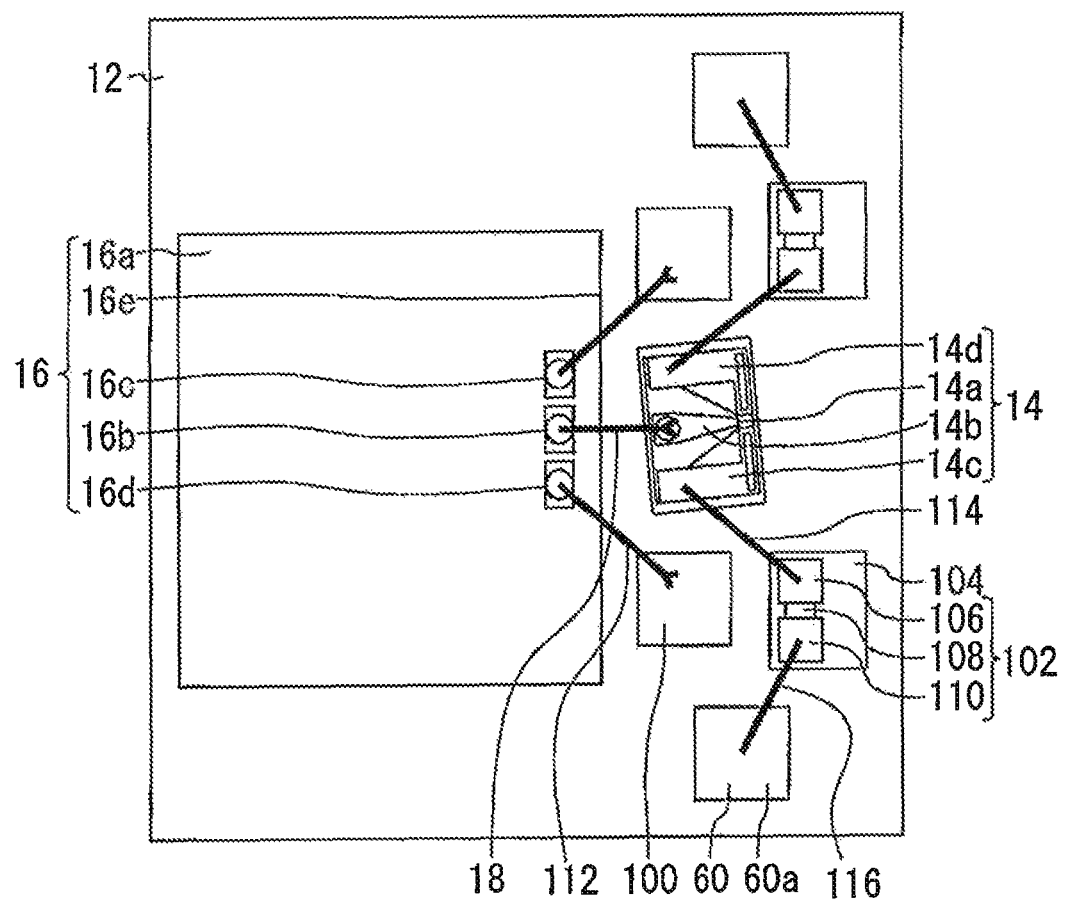
FIG. 5 is a plan view of a first comparative optical receiver module.

Before describing the advantages of the optical receiver module of the first embodiment, comparative optical receiver modules will be described. The following description of these comparative optical receiver modules will be limited to the differences from the optical receiver module 10 of the first embodiment. FIG. 5 is a plan view of a first comparative optical receiver module. The first comparative optical receiver module differs from the optical receiver module of the first embodiment primarily in that the composite component 30 is replaced by a metal portion (or GND post) 100 and a resistive portion 102 which are separate components.

The resistive portion 102 includes a first bonding pad 106, a resistive element 108, and a second bonding pad 110 which are provided on a substrate 104. The GND terminal 16d of the TIA 16 is connected to the top surface of the metal portion 100 by a third wire 112. It should be noted that the metal portion 100 is disposed between the first edge 16e of the TIA 16 and the resistive portion 102. This prevents the resistive portion 102 from being located close to the first edge 16e. As a result, the photodetector 14, the resistive portion 102, and the capacitor 60 are arranged in a staggered fashion; that is, the resistive portion 102 is located closer to the right edge of the carrier 12 than are the photodetector 14 and the capacitor 60, as viewed in FIG. 5. Consequently, the second wire 114 connected between the first bonding pad 106 and the cathode terminal 14c of the photodetector 14 is longer than the second wire 50 shown in FIG. 1, and the fourth wire 116 connected between the second bonding pad 110 and the top surface electrode 60a of the capacitor 60 is longer than the fourth wire 62 shown in FIG. 1.

Figure 6:
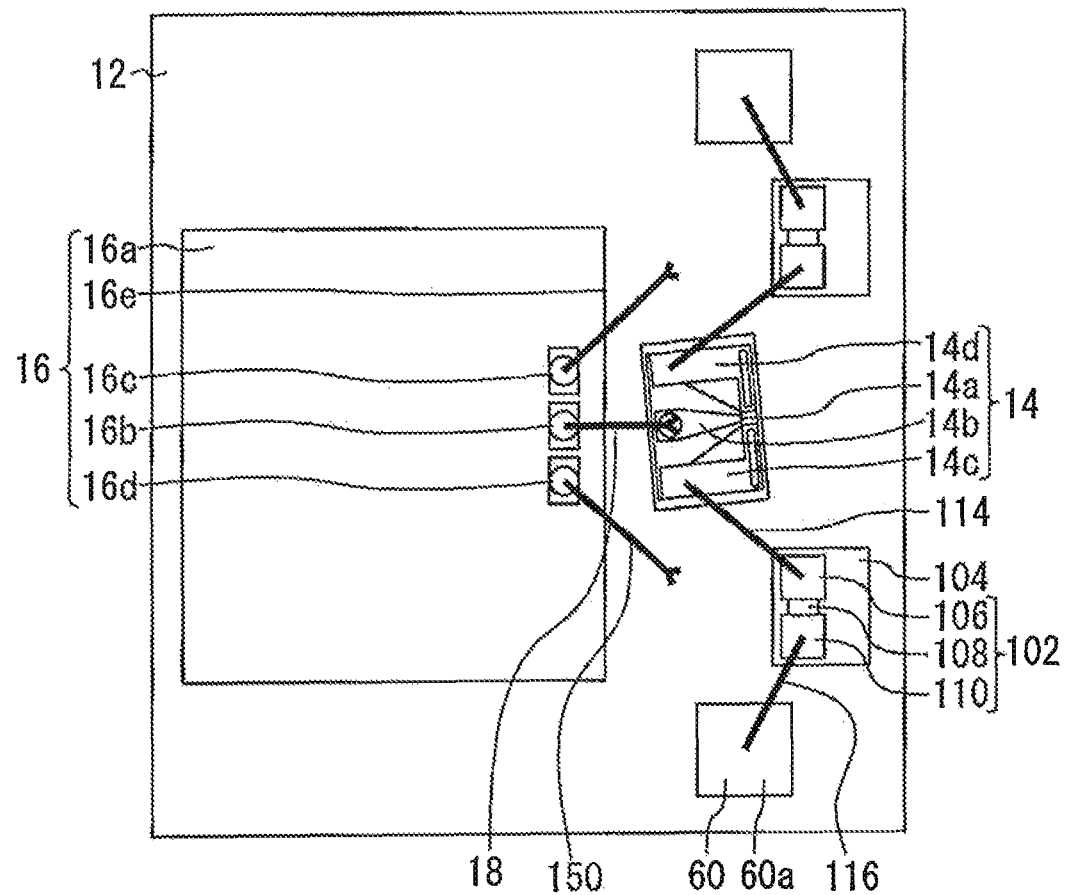
FIG. 6 is a plan view of a second comparative optical receiver module.

FIG. 6 is a plan view of a second comparative optical receiver module. The second comparative optical receiver module differs from the first comparative optical receiver module described above, primarily in that the metal portion 100 is omitted and a third wire 150 (corresponding to the third wire 112 of the first comparative optical receiver module) is directly connected to the carrier 12. However, the resistive portion 102 must be spaced a certain distance from the point on the carrier 12 where the third wire 150 is connected. As a result, the resistive portion 102 is located closer to the right edge of the carrier 12 than are the photodetector 14 and the capacitor 60, as is the case with the first comparative optical receiver module.

Figure 7:
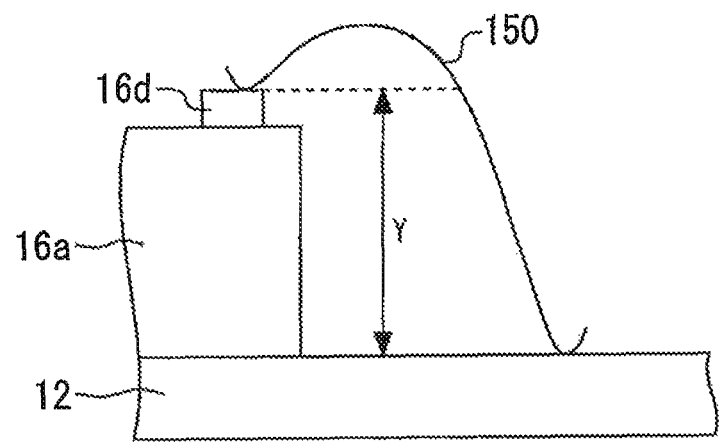
FIG. 7 is an elevational view showing the third wire of the second comparative optical receiver module.
Figure 8:
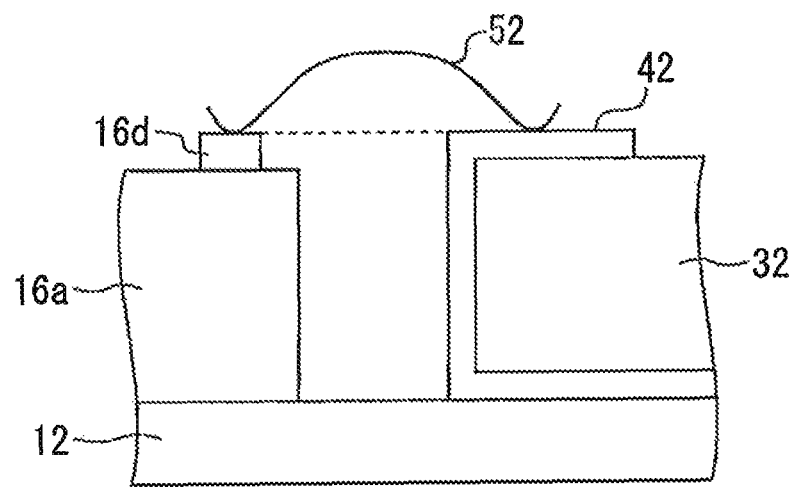
FIG. 8 is an elevational view showing the third wire of the optical receiver module of the first embodiment.

FIG. 7 is an elevational view showing the third wire 150 of the second comparative optical receiver module. The third wire 150 is relatively long, since it extends from the top surface of the GND terminal 16d of the TIA 16 to the carrier 12. FIG. 8 is an elevational view showing the third wire 52 of the optical receiver module 10 of the first embodiment. The top surface of the GND terminal 16d and the top surface of the metal portion 42 of the composite component 30 are spaced equal distances from the carrier 12. Therefore, the third wire 52 is shorter than the third wire 150 of the second comparative optical receiver module by an amount substantially equal to the distance Y shown in FIG. 7. This configuration makes it possible to reduce inductance and thereby stabilize GND potential in the optical receiver module of the first embodiment.

It should be noted that since the TIA 16 is formed of an SiGe-based material, it is difficult to form a through-hole in the TIA 16. This means that it is not feasible to stabilize the GND potential by passing a metal through the thickness of the TIA 16 so that it is in contact with the carrier.

In the first comparative optical receiver module, the presence of the metal portion 100 prevents the resistive portion 102 from being located close to the first edge 16e of the TIA 16. Likewise, in the second comparative optical receiver module, the presence of the connection point of the third wire 150 to the carrier 12 prevents the resistive portion 102 from being located close to the first edge 16e. That is, in either case, the resistive portion 102 must be disposed closer to the right edge of the carrier 12 (i.e., further away from the first edge 16e of the TIA 16) than are the photodetector 14 and the capacitor 60, resulting in the second wire 114 and the fourth wire 116 being relatively long. Consequently, the electrical path from the input terminal of the TIA, through the photodetector, the resistive portion, the capacitor, and the carrier (GND), back to the input terminal of the TIA (this electrical path being hereinafter referred to as the primary electrical path) is relatively long, resulting in a decreased bandwidth of the optical receiver module.

In the optical receiver module 10 of the first embodiment, on the other hand, the composite component 30 has the metal portion 42 (which corresponds to, e.g., the metal portion 100 of the first comparative optical receiver module) and the resistive portion 40 integrated together. Therefore, the resistive portion 40 (or the composite component 30) is located close to the first edge 16e of the TIA 16 so that the resistive portion 40 is close to the photodetector 14 and the capacitor 60. As a result, the second wire 50 shown in FIG. 1 is shorter than the second wire 114 of the comparative optical receiver modules, and the fourth wire 62 shown in FIG. 1 is shorter than the fourth wire 116 of the comparative optical receiver modules. This means that the primary electrical path of the optical receiver module 10 (i.e., the electrical path from the input terminal 16b of the TIA 16, through the photodetector 14, the resistive portion 40, the capacitor 60, and the carrier (GND), back to the input terminal 16b of the TIA 16) is shorter than the primary electrical paths of the comparative optical receiver modules described above. Therefore, the optical receiver module 10 of the first embodiment can be configured to have an increased bandwidth.

Figure 9A:
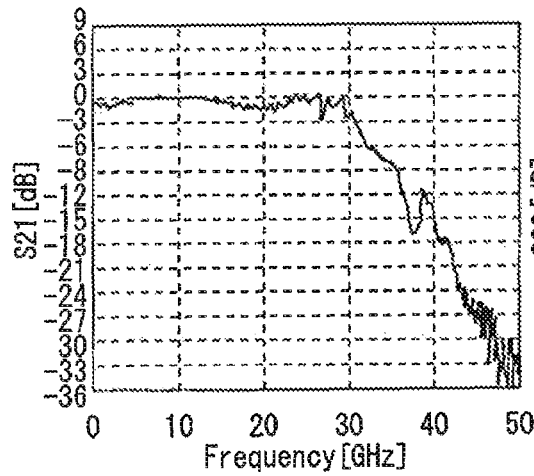
FIG. 9A is a graph of the transmission characteristic (S21) of the optical receiver module of the first embodiment.
Figure 9B:
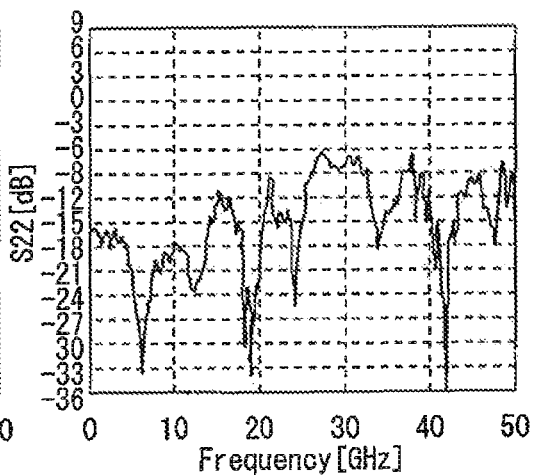
FIG. 9B is a graph of the reflection characteristic (S22) of the optical receiver module of the first embodiment.
Figure 9C:
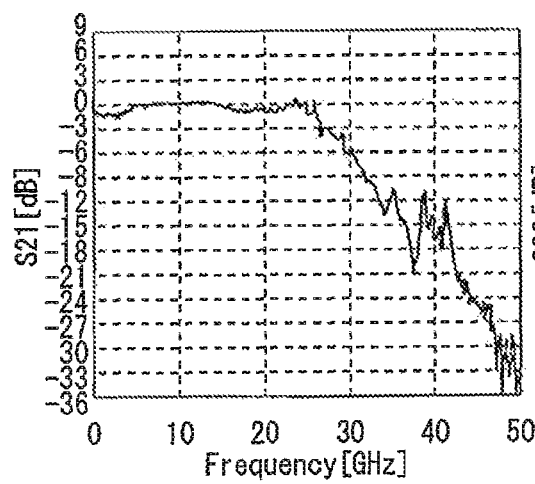
FIG. 9C is a graph of the transmission characteristic (S21) of the first comparative optical receiver module.

FIG. 9 includes FIGS. 9A to 9D showing frequency characteristics of optical receiver modules. Specifically, FIG. 9A is a graph of the transmission characteristic (S21) of the optical receiver module of the first embodiment. FIG. 9C is a graph of the transmission characteristic (S21) of the first comparative optical receiver module. It should be noted that the transmission characteristic (S21) of the second comparative optical receiver module is substantially identical to that of the first comparative optical receiver module shown in FIG. 9C, since their primary electrical paths have substantially the same length.

In order to receive, e.g., a 40 Gbps modulated signal, the optical receiver module must have a bandwidth of approximately 30 GHz or more. As can be seen from FIG. 9A, the optical receiver module of the first embodiment has a 3 dB bandwidth of 30 GHz or more. The first comparative optical receiver module, on the other hand, has a narrower bandwidth than the optical receiver module of the first embodiment, as shown in FIG. 9C. This difference in bandwidth is due to the fact that the optical receiver module of the first embodiment has a shorter primary electrical path than the first and second comparative optical receiver modules.

Figure 9D:
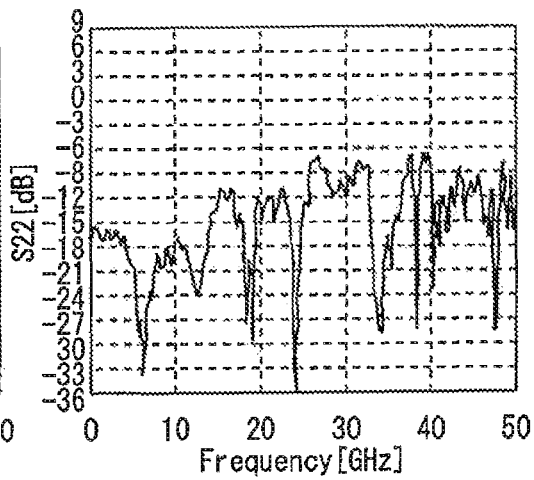
FIG. 9D is a graph of the reflection characteristic (S22) of the first comparative optical receiver module.

FIG. 9B is a graph of the reflection characteristic (S22) of the optical receiver module of the first embodiment. FIG. 9D is a graph of the reflection characteristic (S22) of the first comparative optical receiver module. These reflection characteristics (S22) are substantially equivalent.

Figure 10:
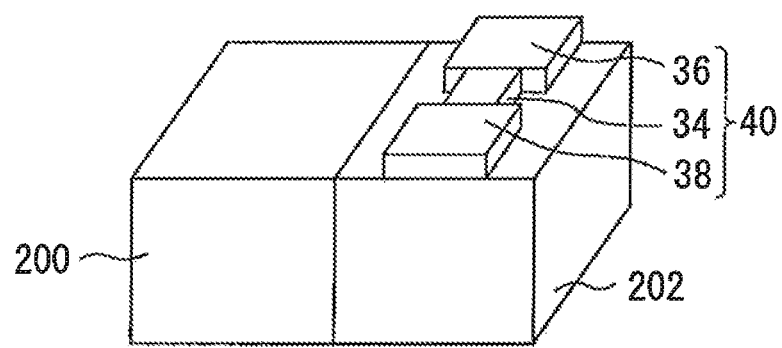
FIG. 10 is a perspective view of a variation of the composite component of the first embodiment.

The composite component of the optical receiver module of the present embodiment may have a different configuration than that shown in FIG. 2 while retaining the advantages described above in connection with the present embodiment. The present embodiment requires only that the composite component include a resistive portion (such as the resistive portion 40) and a metal portion (such as the metal portion 42) which is in contact with the carrier 12 and that these portions be integrated together. FIG. 10 is a perspective view of a variation of the composite component 30 of the first embodiment. This composite component includes a metal plate 200 (corresponding to the metal portion 42 of the present embodiment) and a substrate 202 which has the resistive portion 40 formed thereon. The metal plate 200 and the substrate 202 with the resistive portion 40 thereon are bonded together.

The TIA 16 of the present embodiment is not limited to SiGe-based material. Further, the TIA 16 may be replaced by a different amplifier circuit. Various other alterations may be made to the present embodiment without departing from the scope of the present invention. It should be noted that such alterations may also be made to the optical receiver modules of the subsequently described embodiments.

Second Embodiment

Figure 11:
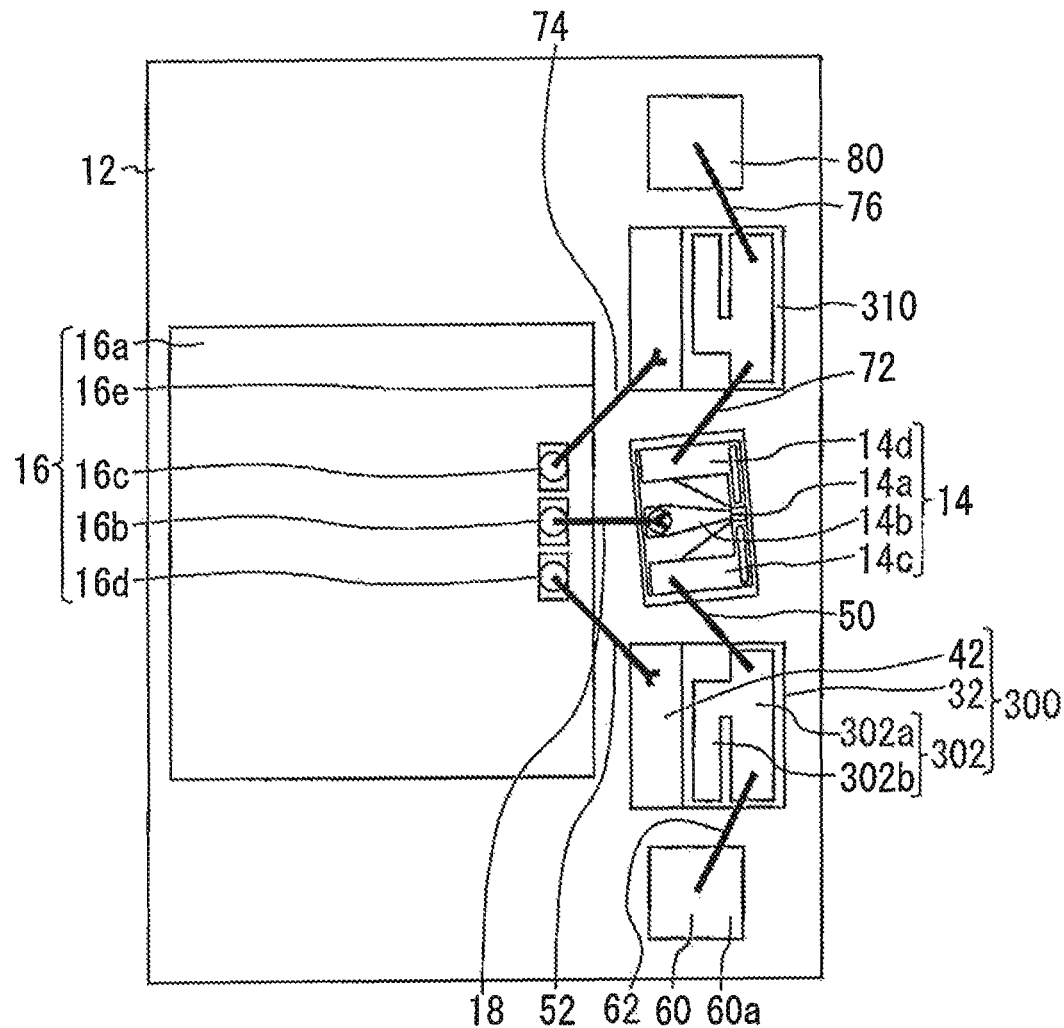
FIG. 11 is a plan view of the optical receiver module of the second embodiment.

A second embodiment of the present invention provides an optical receiver module which has many features common to the optical receiver module of the first embodiment. Therefore, the following description of the second embodiment will be primarily limited to the differences from the first embodiment. FIG. 11 is a plan view of the optical receiver module of the second embodiment. This optical receiver module includes a composite component 300 which has a metal film 302 (corresponding to the resistive portion 40 of the first embodiment) formed on the top surface of the substrate 32.

The metal film 302 includes a trunk portion 302a and a branch portion 302b which extends from the trunk portion 302a and which has an unconnected distal end. The second wire 50 is connected to one end of the trunk portion 302a, and the fourth wire 62 is connected to the other end of the trunk portion 302a. The branch portion 302b functions as an open stub. It should be noted that a composite component 310 which has the same configuration as the composite component 300 is provided on the carrier 12 on the opposite side of the photodetector 14 from the composite component 300.

Figure 12:
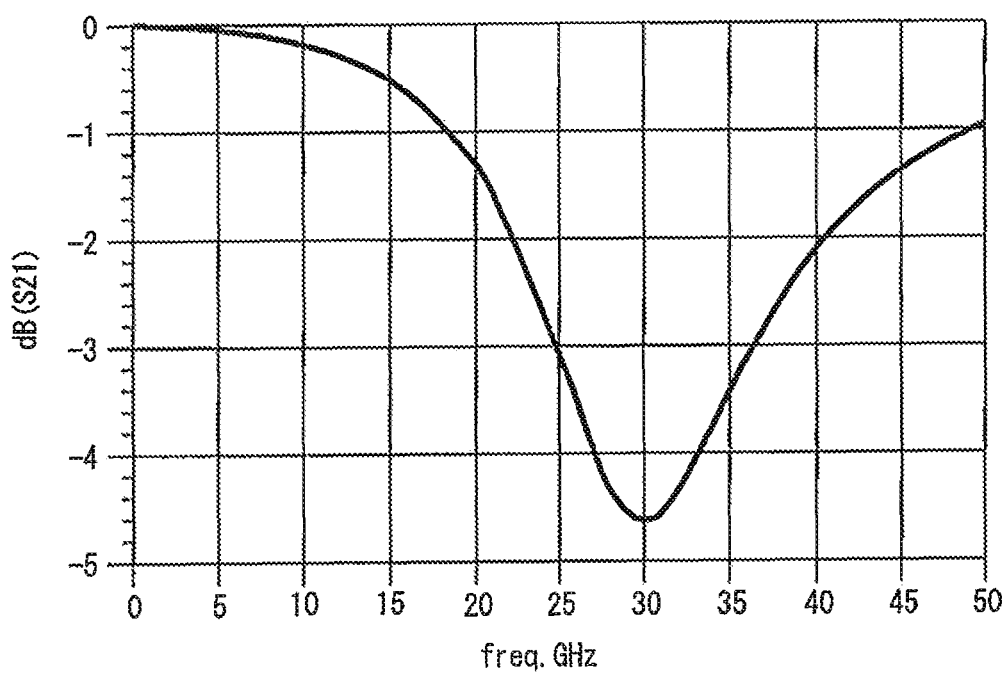
FIG. 12 is a graph of the transmission characteristic (S21) of the branch portion.

FIG. 12 is a graph of the transmission characteristic (S21) of the branch portion 302b, which acts as an open stub. This open stub functions as a filter having an attenuation peak at around 30 GHz. Therefore, the branch portion 302b may be used as a band elimination filter to suppress resonance.

Third Embodiment

Figure 13:
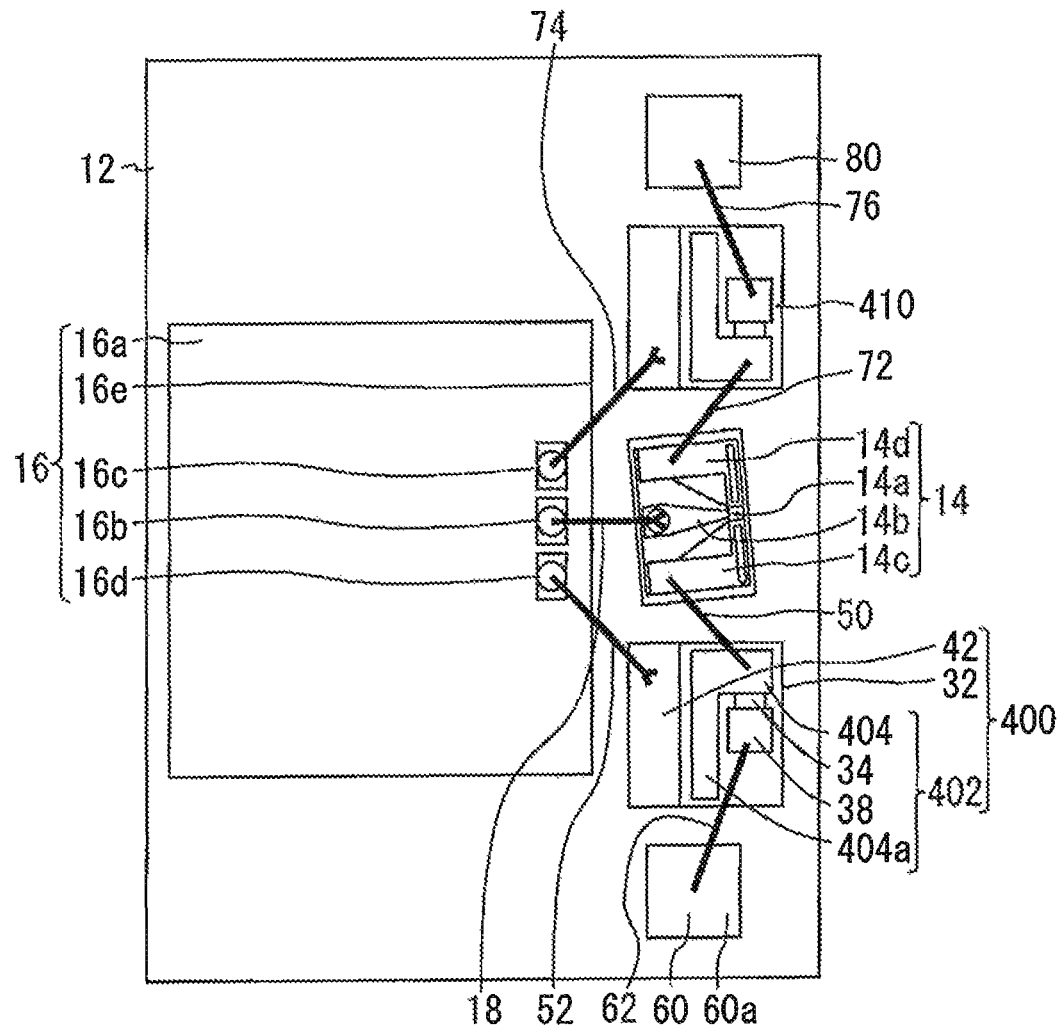
FIG. 13 is a plan view of the optical receiver module of the third embodiment.

A third embodiment of the present invention provides an optical receiver module which has many features common to the optical receiver module of the first embodiment. Therefore, the following description of the third embodiment will be primarily limited to the differences from the first embodiment. FIG. 13 is a plan view of the optical receiver module of the third embodiment. This optical receiver module includes a composite component 400 which has a resistive portion 402.

The resistive portion 402 includes a first bonding pad 404 which is provided with a branch portion 404a having an unconnected distal end. The branch portion 404a functions as an open stub. It should be noted that a composite component 410 which has the same configuration as the composite component 400 is provided on the carrier 12 on the opposite side of the photodetector 14 from the composite component 400. The branch portion 404a may be used as a band elimination filer. Both the branch portion 404a and the resistive element 34 serve to suppress resonance.

Thus the present invention provides an optical receiver module having an increased bandwidth and in which the amplifier circuit has a stable GND potential.

Obviously many modifications and variations of the present invention are possible in the light of the above teachings. It is therefore to be understood that within the scope of the appended claims the invention may be practiced otherwise than as specifically described.

What is claimed is:

1. An optical detector module comprising:
   a carrier;
   a photodetector secured to a top surface of said carrier and having a light detecting portion, an anode terminal, and a cathode terminal, said photodetector converting an optical signal into an electrical signal;
   an amplifier circuit secured to said top surface of said carrier and having a first edge, an input terminal, and a GND terminal, said input terminal and said GND terminal being located along said first edge;
   a first wire connecting said anode terminal to said input terminal;
   a composite component secured to said top surface of said carrier and having a metal portion and a resistive portion integrated together, said metal portion being in contact with said carrier;
   a second wire connecting said cathode terminal to a first end of said resistive portion;
   a third wire connecting said GND terminal to a top surface of said metal portion;
   a capacitor having a top surface electrode and a bottom surface electrode and which is secured to said carrier; and
   a fourth wire connecting said top surface electrode to a second end of said resistive portion.

2. The optical detector module according to claim 1, wherein said composite component includes
   a substrate,
   a metalized bottom surface portion located on a bottom surface of said substrate and in contact with said carrier,
   a metalized side surface portion that is integral with said metalized bottom surface portion and located on a side surface of said substrate,
   a metalized top surface portion that is integral with said metalized side surface portion and located on a portion of a top surface of said substrate,
   a resistive element located on said top surface of said substrate,
   a first bonding pad located on said top surface of said substrate and connected directly to a first end of said resistive element, and
   a second bonding pad located on said top surface of said substrate and connected directly to a second end of said resistive element, wherein
      said metal portion extends from said metalized bottom surface portion and said metalized side surface portion, and to said metalized top surface portion, and
      said resistive portion extends from said resistive element and said first and second bonding pads.

3. The optical detector module according to claim 1, wherein said composite component includes
   a substrate,
   a resistive element located on a top surface of said substrate,
   a first bonding pad located on said top surface of said substrate and connected directly to a first end of said resistive element, and
   a second bonding pad located on said top surface of said substrate and connected directly to a second end of said resistive element, wherein said first bonding pad has a branch portion functioning as an open stub.

4. The optical detector module according to claim 1, wherein said metal portion a metal plate, and said composite component comprise said metal plate and said resistive portion bonded together.

5. The optical or detector module according to claim 1, wherein
   said composite component includes a substrate, and
   said resistive portion is a metal film which is located on a top surface of said substrate and which has a branch portion functioning as an open stub.

6. The optical detector module according to claim 1, wherein said amplifier circuit a SiGe-based material.

7. The optical detector module according to claim 1, wherein a top surface of said GND terminal and a top surface of said metal portion are spaced equal distances from said carrier.

8. The optical detector module according to claim 1, wherein said photodetector, said composite component, and said capacitor are arranged in a line along said first edge, as viewed in plan.

* * * * *